US006690631B2

(12) United States Patent
De Cuyper (10) Patent No.: US 6,690,631 B2
(45) Date of Patent: Feb. 10, 2004

(54) CLOCK GENERATION CIRCUIT AND INTEGRATED CIRCUIT FOR REPRODUCING AN AUDIO SIGNAL COMPRISING SUCH A CLOCK GENERATION CIRCUIT

(75) Inventor: Steven Hilaire De Cuyper, Leuven (BE)

(73) Assignee: Koninklijke Philips Electronics N.V., Eindhoven (NL)

(*) Notice: Subject to any disclaimer, the term of this patent is extended or adjusted under 35 U.S.C. 154(b) by 35 days.

(21) Appl. No.: 09/989,254

(22) Filed: Nov. 20, 2001

(65) Prior Publication Data

US 2002/0080704 A1 Jun. 27, 2002

(30) Foreign Application Priority Data

Nov. 23, 2000 (EP) .............................. 00204166

(51) Int. Cl.[7] .............................................. G11B 7/007
(52) U.S. Cl. ................ 369/47.3; 369/53.34; 369/59.19; 327/113; 327/141; 327/175
(58) Field of Search ....................... 369/47.28, 47.3, 369/53.34, 59.19, 44.28, 30.13; 327/113, 141, 175; 375/239

(56) References Cited

U.S. PATENT DOCUMENTS

| | | | | | |
|---|---|---|---|---|---|
| 4,669,089 | A | * | 5/1987 | Gahagan et al. ............. | 375/146 |
| 5,341,479 | A | * | 8/1994 | Dean et al. .................. | 395/250 |
| 5,666,079 | A | * | 9/1997 | Ma .............................. | 327/276 |
| 5,737,373 | A | * | 4/1998 | Sato et al. ................... | 375/376 |
| 5,844,865 | A | * | 12/1998 | Bakx .......................... | 369/47 |
| 5,999,026 | A | | 12/1999 | Vorenkamp et al. ........ | 327/156 |
| 6,028,727 | A | * | 2/2000 | Vishakhadatta et al. ...... | 360/51 |
| 6,294,944 | B1 | * | 9/2001 | Shiochi et al. ............... | 327/333 |
| 6,320,437 | B1 | * | 11/2001 | Ma .............................. | 327/175 |
| 6,441,659 | B1 | * | 8/2002 | Demone ...................... | 327/156 |
| 6,486,857 | B1 | * | 11/2002 | Esaki et al. .................. | 345/13 |

FOREIGN PATENT DOCUMENTS

| EP | 0440357 A2 | 8/1991 | ............. G06F/1/12 |
|---|---|---|---|
| EP | 0440357 A3 | 8/1991 | ............. G06F/1/12 |
| EP | 0551969 A3 | 7/1993 | ............. G06F/1/04 |
| EP | 0551969 A2 | 7/1993 | ............. G06F/1/04 |

OTHER PUBLICATIONS

PHN 17, 747 U.S. Ser. No.: 09/708151 Filed Nov. 8, 2000. Inventor(s) Albert H. Immink et al. Title: Device for Writing Information Onto an Information Carrier.

* cited by examiner

Primary Examiner—Gautam R. Patel
(74) Attorney, Agent, or Firm—Jack D. Slobod (57) ABSTRACT

A clock generation circuit and device are disclosed for reading/writing information from to/an information carrier. The clock generation circuit includes a frequency divider for generating a first intermediate clock signal from an input clock signal. A first logical unit combines the input clock signal and the intermediate clock signal. The circuit further includes a clocked bistable unit having a clock input coupled to an output of the first logical unit, and a data input and a data output, and a second logical unit having a selection input for receiving a synchronization signal from a synchronization module having an input for receiving a reference clock signal. The synchronization signal controls selection between a feedback mode and a reset mode. In the feedback mode, the second logical unit logically inversely couples the data input to the data output, and in the reset mode the second logical unit provides a reset value to the data input. The data output provides the output clock signal.

6 Claims, 6 Drawing Sheets

CLOCK GENERATION CIRCUIT AND INTEGRATED CIRCUIT FOR REPRODUCING AN AUDIO SIGNAL COMPRISING SUCH A CLOCK GENERATION CIRCUIT

FIELD OF THE INVENTION

The invention relates to a clock generation circuit.

The invention further relates to an integrated circuit for reproducing an audio signal comprising such a clock generation circuit.

BACKGROUND OF THE INVENTION

In many electronic circuits, particularly those utilizing digital electronics and computers, it is necessary to produce clock signals having a number of different frequencies. In particular this issue arises in optical recording systems, where different steps in the process of converting an input signal into a write signal have to be synchronized to each other. Said process generally comprises the steps of encoding the input signal with an error correcting code, such as a cross interleaved Reed-Solomon code. Channel encoding the signal so obtained with a channel code, e.g. EFM-modulation. Generating a write signal which achieves that said channel encoded signal is written as accurately as possible at the record carrier. For this purpose a write strategy generator is used which generally requires a clock signal which has a frequency which is significantly higher than the frequency which is used for clocking the channel encoder. Such a write strategy generator is described for example in the non-prepublished patent Application PHN 17747. Often an external phase locked loop is used to generate the clock frequency for the write strategy generator. It has been found necessary to generate a clock signal for said PLL having the same frequency and phase as a reference clock, but has a duty cycle of 50%, independent of the duty cycle of the reference clock.

SUMMARY OF THE INVENTION

It is a purpose of the invention to provide a clock generation circuit which generates an output clock having the same frequency and phase as a reference clock, but has a duty cycle of 50%, independent of the duty cycle of the reference clock. In accordance therewith, the clock generation circuit of the invention comprises an input for receiving an input clock signal a frequency divider for generating a first intermediate clock signal a first logical unit for combining the input clock signal and the intermediate clock signal a clocked bistable unit having a clock input coupled to an output of the first logical unit, and a data input and a data output, a second logical unit having a selection input for receiving a synchronization signal that controls selection between a feedback mode and a reset mode, in which feedback mode the second logical unit logically inverse couples the data input to the data output, and in which reset mode the second logical unit couples the data input to a synchronization module having an input for receiving a reference clock signal, an output coupled to the data output for providing the output clock signal.

In the feedback mode the input of the clocked bistable unit is coupled to its data output in a logically inverse sense. Hence, the clocked bistable unit, such as a flip-flop then generates an output signal having half the frequency of the intermediate clock signal, but having a duty cycle of 50%. In the reset mode however, the clocked bistable unit receives a reset value via the second logical unit, which allows the clock generation circuit to synchronize the output clock signal with a reference clock signal.

EP 551 969 A2 describes a clock generation circuit in which a master clock is divided by an odd integral value by a synchronous state machine. Subsequently an output clock having a 50% duty-cycle is generated by combining an output signal of the synchronous state machine with the master clock signal. No means are disclosed for synchronizing the rising edge of the output clock with the rising edge of an input clock having the same frequency as the output clock.

EP 440 357 A2 describes a clock generation circuit which generates a plurality of clock signals from an input clock signal having different phase relationships to the input clock signal. One of the plurality of clock signals which closest matches the phase of the input clock signal is selected. Although the output clock signal has substantially the same frequency and phase as the input clock signal it is not realized therein that the output clock has a 50% duty-cycle independent of the duty-cycle of the input clock.

U.S. Pat. No. 5,999,026 describes a resynchronization device which resynchronizes a binary signal with a clock having a relatively high frequency. The device comprises a resynchronization module, in which the output is coupled to the input which receives the binary signal by a first and a second flip flop of which the first is clocked at the falling edge and the other at the rising edge of the clock. The first flip-flop may be bypassed via a multiplexer. This device does not make it possible to produce an output clock signal having the same frequency and phase as a reference clock signal, but having a duty-cycle of 50% independent of the duty-cycle of said reference clock signal.

In an embodiment the clock generation circuit is characterized in that the synchronization module comprises a third logical unit, a first further clocked bistable unit having a data-input coupled to an output of the third logical unit, a second further clocked bistable unit having a data input coupled to a data output of the first further clocked bistable unit and a third further clocked bistable unit having a data input coupled to a data output of the second further clocked bistable unit, the third logical unit having a first input for receiving a signal which represents the start of a sync procedure, a second input coupled to the data output of the first further clocked bistable unit and a third input coupled to the second further clocked bistable unit for stopping the sync procedure, the input for receiving the reference clock signal being coupled to a clock input of the second further clocked bistable unit.

An embodiment of the clock generation circuit of the invention is characterized in that the first logical unit comprises a further negatively triggered bistable unit and a logical gate, wherein the input clock signal serves as a clock signal for the further negatively triggered bistable unit and wherein the logical gate receives the intermediate clock signal via the further negatively triggered bistable unit as a first input signal and the input clock signal as a second input signal. The combination of the negatively triggered bistable unit and the logical gate ensures that an output signal is generated which is independent of small delays in the intermediate clock signal. The intermediate clock signal therefore need not be balanced.

BRIEF DESCRIPTION OF THE DRAWINGS

These and other aspects of the invention are described with reference to the drawings. Therein.

DETAILED DESCRIPTION OF THE PREFERRED EMBODIMENTS

Figure 1:
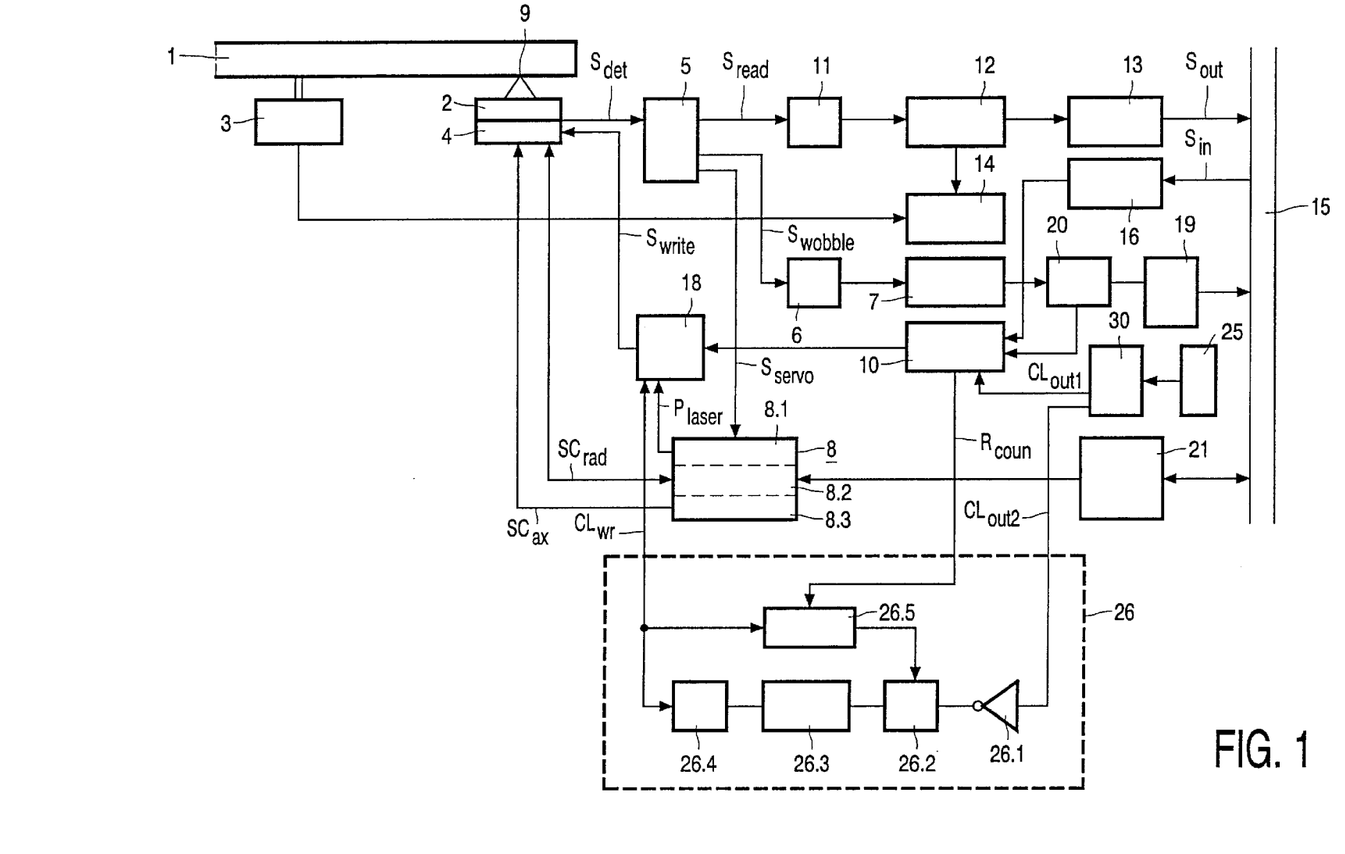
FIG. 1 shows a block diagram of a device for reading and/or writing information from/to an information carrier.

FIG. 1 shows a block diagram of a device for reading and/or writing information from/to an information carrier 1. The device comprises a read/write head 2 for reproducing a read signal Sread which is represented as a physically detectable pattern in tracks at the information carrier 1 and/or for storing a write signal Swrite in the form of a physically detectable pattern in tracks at the information carrier. In the embodiment shown the information carrier is disc shaped and the information is stored in the form of optically detectable patterns at the record carrier. The optical pattern is for example stored in a phase change medium such as GeSbTe or AgInSbTe. The device according to the invention further comprises movement means for causing a relative movement between the information carrier 1 and the read/write head 2. The movement means comprise a spindle motor 3 for rotating the information carrier and radial movement means 4 for radially moving the read head. The radial movement means may e.g. comprise a slide or a swing arm for radially moving the read head. In addition the read head 2 may comprise fine positioning means, such as an actuator for moving a lens or a mirror in an optical system forming part of the read/write head. The read/write head 2 comprises optical detectors, which generate detection signals Sdet. A signal processor 5 generates from these signals a wobble signal Swobble and servo signals Sservo. The wobble signal Swobble is provided via a A/D-converter 6 to a wobble processor 7. The servo signals Sservo are provided to a servo unit 8, which comprises a first servo module 8.1 for controlling the laser power, a second servo module 8.2 for controlling the radial position which is scanned by the read/write head, and a third servo module 8.3 for axial control, i.e. to maintain the scanning spot 9 with which the read/write head 2 scans the information carrier 1 in focus. In order to control the radial position which is scanned by the read/write head 4, the second servo module 8.2 provides servo control signals SCrad to the radial movement means.

The second servo module 8.2 may estimate the radial position on the basis of the servo signals Sservo, which are derived from the detection signals Sdet. However the radial position may otherwise, or in addition be estimated from measurement signals which are obtained by measuring a position of a motor, which controls the radial position of the read/write head 2. Such measurement signals are e.g. obtained with Hall-elements. The third servo module controls the axial position by means of axial control signals SCax. A device according to the invention may have a read mode, a write mode or both. In a read mode the signal processor 5 provides a read signal Sread via an A/D-converter 11 to a bitdetector and demodulator 12. The demodulated signal is provided to an error correcting unit 13 which on its turn provides the error corrected signal Sout to an output bus 15 i.e. a serial bus or a IEC958 bus. The bitdetector and demodulator 12 also provides a control signal to a motor controller 14 so as to control the speed with which the information is read from the information carrier 1. In a write mode of the device, an input signal Sin is received from the bus 15. The input signal Sin is subsequently encoded with an error correction code e.g. by a CIRC-encoder 16 and channel encoded by channel encoder 10 and provided to a write strategy generator 18 to generate a write signal Swrite. The write strategy generator 18 is controlled by the servo control signal Plaser generated by the first servo module 8.1. The device shown also comprises CDtext decoder/encoder 19 and encode controller 20 by means of which CDtext may be included in the subcode of the signal which is written at the information carrier 1. The wobble processor 7 provides a clock signal to a channel encoder 10, so that the information is written at the information carrier 1 at a speed which corresponds to the linear velocity of the information carrier 1. The device shown in FIG. 1 further comprises a microprocessor 21 which allows high level control of the servo unit 8. The microprocessor 21 may e.g. control startup procedures for radial and axial control, and calibration procedures for controlling the laser power. The device shown in FIG. 1 comprises a clock generator 30 which receives an input signal CLin from an analogue unit 25. The clock generator provides a first clock signal Clout1 for the channel encoder 10. This clock signal CLout1 need not necessarily have a duty cycle of 50%. The clock generator 30 also provides a clock signal CLout2 for an external PLL which generates a clock frequency CLwr for the write strategy generator 18. As shown in FIG. 1 the phase locked loop 26 comprises an inverting buffer 26.1 for receiving the input clock signal CLout2, a phase detector 26.2, a low-pass filter 26.3, a controllable oscillator 26.4 and a count-down unit 26.5 which functions as a divider. On the one hand the count down unit 26.5 is reset by the control signal Rcoun, which is generated by the channel encoder 10, and which is aligned with the positive flanges of the signal CLout1. On the other hand the inverting buffer 26.1 of the PLL 26 entails that the PLL is clocked at the negative flanges of the clock signal CLout2. This entails the requirement that the clock frequency CLout2 has a 50% duty-cycle.

Figure 2:
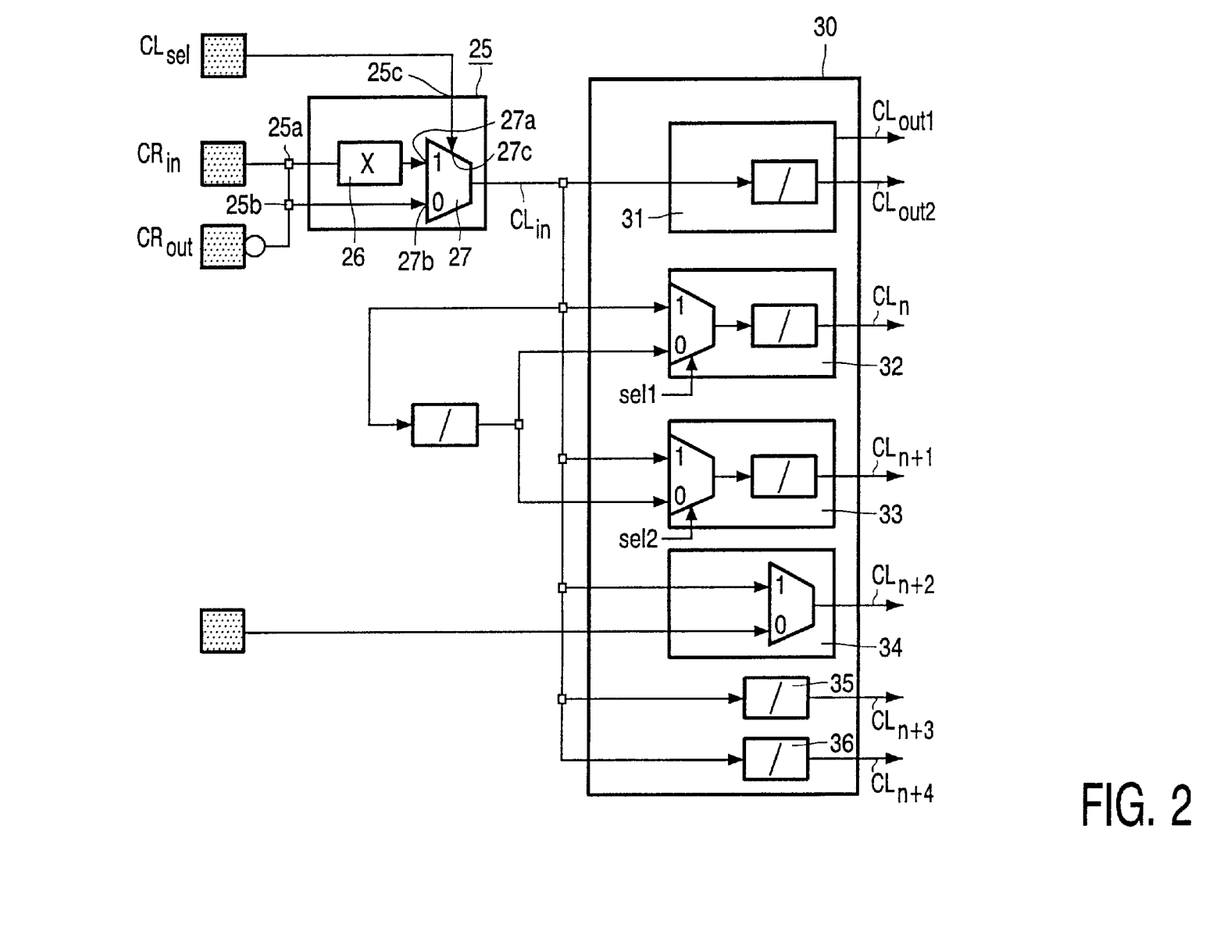
FIG. 2 shows a clock generator included in the device of FIG. 1.

As shown in FIG. 2 the clock generator 30 receives an input signal CLin from an analogue unit 25 comprising a first and a second clock input 25a, 25b for receiving a source clock signal CRIN from a crystal oscillator (not shown), a selection input 25c for receiving a selection signal CLsel. The first clock input 25a is coupled via a frequency multiplier 26 to a first data input 27a of a multiplexer 27. The second clock input 25b is directly coupled to a second data input 27b of said multiplexer 27. The selection input 25c is coupled to a selection input 27c of that multiplexer 27. The output signal CLin of that multiplexer 27 forms the input clock signal for the clock generator 30. The clock generator 30 comprises a first 31 until a sixth module 36. The modules 31–36 comprise programmable dividers and multiplexers to select the proper frequency of the clock signals. The first module 31 provides a.o. the clock signals CLout1 and CLout2. The other modules 32–36 provide a.o. the clock signals CLn . . . , CLn+4.

Figure 3:
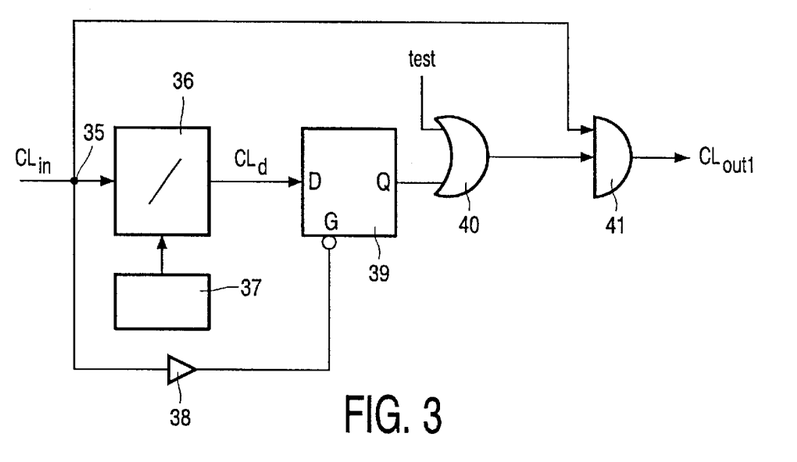
FIG. 3 shows a first part of the clock generator of FIG. 2 in more detail.

FIG. 3 shows a part of the first module 31 which generates the clock signal CLout1 from the input clock signal CLin received at input 35. This clock signal CLout1 has a frequency which is lower than the frequency of the input clock CLin by an integral division factor D. To this end a programmable frequency divider 36 is coupled to the input 35 for generating an intermediate clock signal CLd. The division factor of the programmable frequency divider 36 may be modified by writing to a control register 37. The input clock signal CLin is buffered by a buffer 38 and used as a clock signal for a negatively clocked latch 39 via which the programmable divider 36 is coupled to a first logical gate 40. In casu this logical gate 40 is an OR-gate, which has a testmode signal 'test' as a further input. The output signal of the OR-gate 40 is provided to an AND-gate 41. The output signal of the OR-gate is 'ANDed' at the gate 41 with the CLin signal. In this way an output signal Clout1 is obtained having a frequency which is lower than the frequency of the input clock CLin by an integral division factor and which has a duty cycle which is substantially less than 50%.

Figure 4:
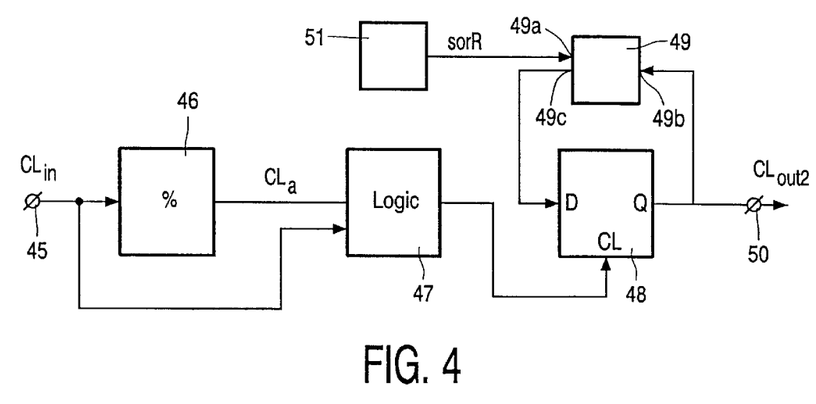
FIG. 4 shows a second part of the clock generator of FIG. 2 in more detail while the first part is shown more generalized.

FIG. 4 shows a further part of the first module 31 which generates the clock signal CLout2. This clock signal CLout2 has a frequency which is lower than the frequency of the input clock CLin by the same integral division factor D as applies for the clock signal CLout1. The further part of the first module comprises a further programmable divider 46 which receives the input clock CLin from input 45 and which provides an intermediate clock signal CLa which has a frequency twice the frequency of CLout1. The input clock signal CLin and the intermediate clock signal CLa are combined in a first logical unit 47. An output of the first logical unit 47 is coupled to a clock input CL of a clocked bistable unit, i.c. a flip-flop 48. The latter further has a data input D and a data output Q. The clock generation circuit further comprises a second logical unit 49 having a selection input 49a for receiving a synchronization signal SorR that controls selection between a feedback mode and a reset mode. In the feedback mode the second logical unit 49 logically couples the data input D inversely to the data output Q. In the reset mode the second logical unit 49 provides a reset value to the data input D. The data output Q of the flip-flop 48 is coupled to an output 50 for providing the output clock signal CLout2. It will be clear to the person skilled in the art that the first 47 and the second logical unit 49 may be implemented in several ways. The synchronization signal SorR is generated by a synchronization module 51. The latter is described in more detail with reference to FIG. 8.

Figure 5:
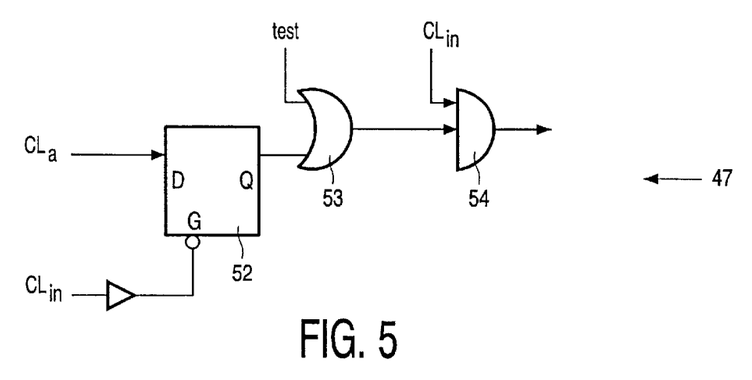
FIG. 5 shows a first module of the second part in more detail.

FIG. 5 shows an embodiment of the first logical unit 47. In order to prevent clock skew the first logical unit 47 is implemented analogously as in the part shown in FIG. 3. As can be seen in FIG. 5 it comprises a negatively triggered latch 52 having a data input D for receiving the intermediate clock signal CLa and an output Q coupled to a first logical gate 53, here an OR-gate, for combining the output signal of the latch 52 with the testmode signal. An output of the first logical gate 53 is coupled to a second logical gate 54. The second logical gate, in casu an AND gate 54 combines the output signal of the OR-gate with the CLin signal. The output signal of the second logical gate 54 has a well defined phase, while the occurrence of spikes is prevented.

Figure 6:
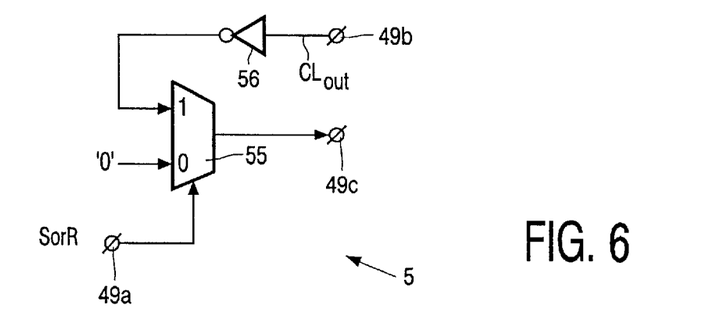
FIG. 6 shows an alternative embodiment of said module.

FIG. 6 shows an embodiment of the second logical unit 49. In the embodiment shown the second logical unit 49 has a multiplexer 55 having a first data input which is coupled via an inverter 56 to data input 49b, which on its turn is coupled to the output of the flip flop 48. The multiplexer 55 has a further data input which receives a constant logical value '0'. The multiplexer 55 has a selection input which is coupled to the selection input 49a, for receiving the signal SorR.

Figure 7:
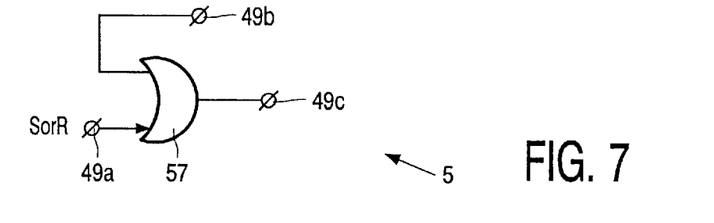
FIG. 7 shows a second module of the second part in more detail.

FIG. 7 shows another embodiment of the second logical unit 49. In this case the second logical unit is implemented as a NOR-gate 57, having a first input coupled to the input 49a for receiving the SorR signal, a second input coupled to input 49b for receiving the output signal of the flip-flop 48 and an output coupled to the output 49c for providing an output value to the flip-flop.

Figure 8:
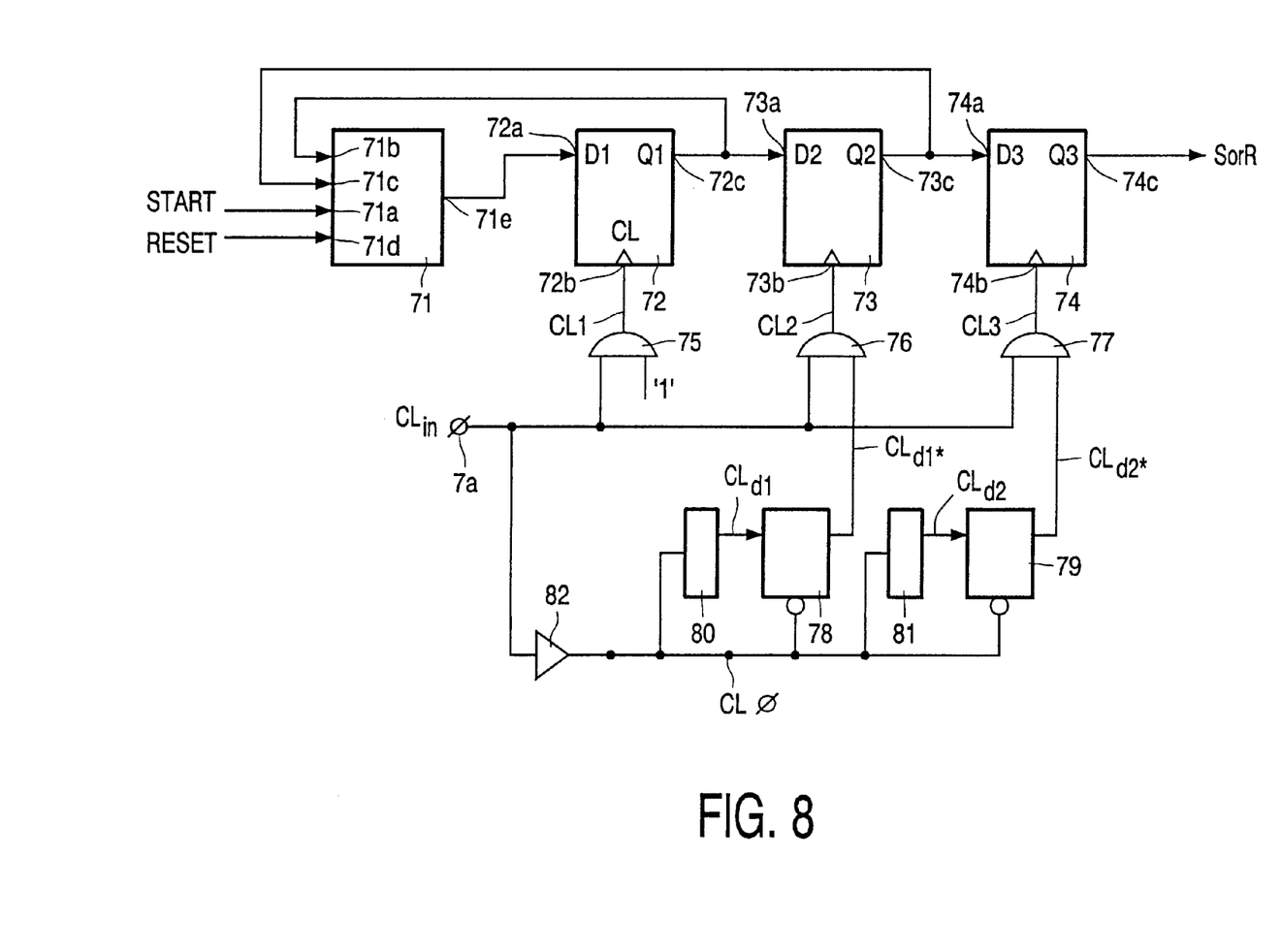
FIG. 8 shows a third module of the second part in more detail.

FIG. 8 shows the synchronization module 51 in more detail. The synchronization module 51 shown therein comprises a third logical unit 71, a first further flip-flop 72 having a data-input 72a coupled to an output 71e of the third logical unit 71. A second further flip-flop 73 has a data input 73a coupled to a data output 72c of the first further flip-flop 72 and a third further flip-flop 74 having a data input 74a coupled to a data output 73c of the second further flip-flop 73. The third logical unit 71 has a first input 71a for receiving a signal START, representing the start of a sync procedure. The third logical unit 71 also has a second input 71b coupled to the output 72c of the first further flip-flop 72 and has a third input 71c coupled to the output 73c of the second further flip-flop 73 for stopping the sync procedure. The third logical unit 71 further has a reset input 71d for bringing the synchronization module 51 in a predefined state when a signal RESET is received. The first further flip-flop 72 is clocked by the CLin signal via the AND-gate 75. In this way the clock signal CLin is delayed by the same amount, as is the case in the first logical unit 3, shown in FIG. 5. The second further flip-flop 73 is clocked by a clock signal CL2. As can be seen from a comparison of the FIGS. 3 and 8, this clock signal is generated in the same manner as CLout1. I.e. The clock signal CL2 is derived from the CLin signal via a first buffer 82, a divider 80, a negative triggered latch 78 and an AND-gate 76. The divider 80 generates a clock signal CLd1 which has a frequency half that of the intermediate clock signal CLa generated by divider 2 in FIG. 4. The third further flip-flop 74 is clocked by a clock signal CL3. This clock signal is derived from the CLin signal via the first buffer 82, a divider 81, a negatively triggered latch 79 and an AND-gate 77. The divider 81 generates a clock signal CLd2 which has a frequency equal to that of the intermediate clock signal CLa generated by divider 2 in FIG. 4.

Figure 9:
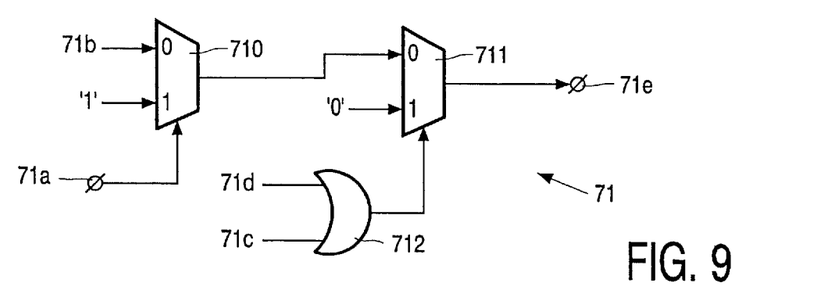
FIG. 9 shows a first embodiment of a part of the third module.

FIG. 9 shows a first embodiment of the third logical unit 71. In said embodiment the third logical unit 71 comprises a first and a second multiplexer 710, 711, and an OR-gate 712. The first multiplexer 711 has a selection input which forms the first input 71a of the third logical unit 71. Depending on the signal received at said input 71a, the multiplexer 710 selects either the input signal at 71b, or a constant logical value '1' as its input. The output of the first multiplexer 710 is coupled to a first input of the second multiplexer 711. A second input of that multiplexer receives a constant logical value '0'. Its selection input is controlled by the output signal of an OR-gate 712. The inputs of the OR-gate are 71c and 71d. Hence, in case a reset signal occurs at input 71d, or the output of the second further flip-flop 73 has a high logical value, the multiplexer 711 selects the value '0' offered at its second input.

Figure 10:
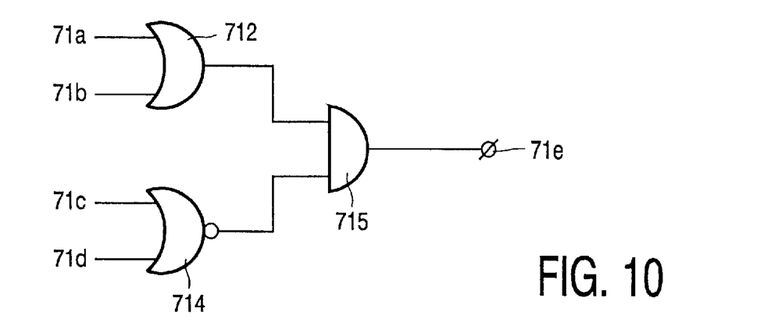
FIG. 10 shows a second embodiment of a part of the third module.

FIG. 10 shows an alternative embodiment of the third logical unit 71. It comprises an OR-gate 713, a NOR-gate 714 and an AND-gate 715. During an active state of the signal RESET, or a high-output state of the second further flip-flop 73, the output of the NOR-gate 714, and as a result the output of the AND-gate 715 is '0'. Otherwise, the output value of the AND-gate is '1' if either the value of the signal START at the input 71a is '1', or the output signal of the first flip-flop 72 is '1'.

Figure 11:
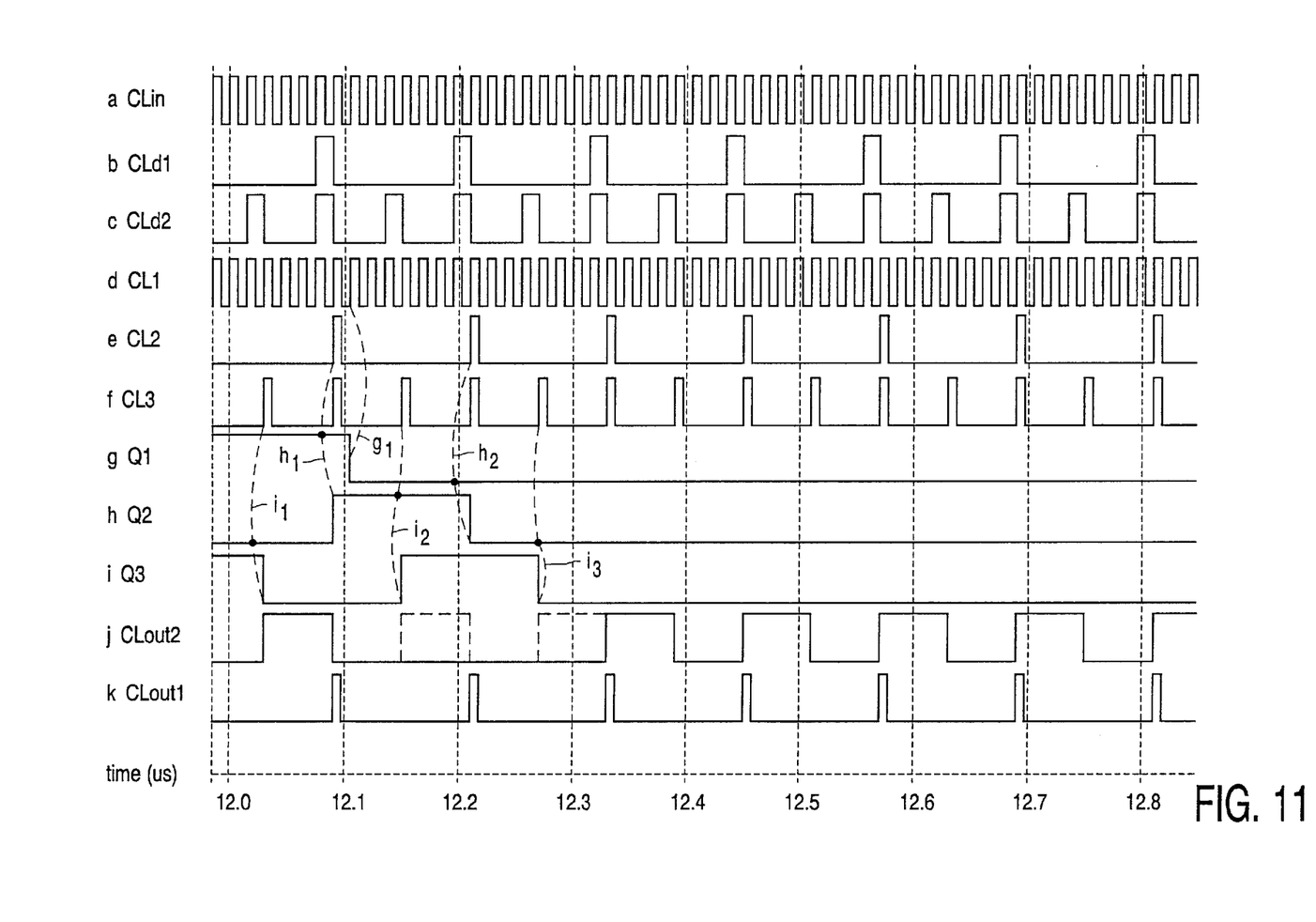
FIG. 11 shows several signals occurring in the clock generator.

FIG. 11 shows a timetable in which the generation of the synchronization signal is clarified.

In FIG. 11a the clock signal CLin is shown.

FIG. 11b displays the signal CLd1, having a frequency which is ⅛ the frequency of CLin. The signal CLd1 is latched by latch 78 at negative transitions of CL0, which is a buffered version of CLin. Subsequently this signal is ANDed with the CLin signal, to form the signal CL2.

FIG. 11c shows the signal CLd2, which has a frequency twice as high as the signal CLd1. CLd2 therefore has a frequency which is ¼ of the frequency of CLin to form the signal CL3.

FIG. 11d displays the signal CL1 which is the output of the AND-gate 75, which is delayed slightly with respect to CLin.

FIG. 11e shows the output signal CL2 of the AND-gate 76.

FIG. 11f shows the output signal CL3 of the AND-gate 77 coupled to the latch 79 which receives the signal CLd2.

FIG. 11g shows the output signal Q1 of the first flip-flop 72. In the embodiment shown a value "1" of this output signal is generated if the signal START is active. This is for example the case if the division ratio of a programmable divider is changed by writing to a register. This has the result that the output of the first multiplexer 710, and therewith the output of the second multiplexer 711 assumes the value '1'. After the first positive transition of the signal CL1 the output Q1 of the first flip-flop 72 also assumes value '1'.

FIG. 11h the dashed line h1 shows that at a positive transition of the clock CL2 the value of Q1 is clocked in the second flip-flop 73 so that the output Q2 also assumes value 1. This has the result that the second data-input of the second multiplexer 711 is selected, so that the data input 72a of the first flip-flop 72 receives a "0". This value is clocked in in the first flip-flop 72 on the next transition of CL1 (See dashed curve g1). The output of that first flip-flop 72 then becomes "0" again. This value is clocked in in the second flip flop 73 in the next transition of CL2, as is illustrated by the dashed curve h2, so that the output Q2 again assumes value "0". The third flip-flop 74 clocks in the value Q2 at the positive transitions of the clock CL3 (See e.g. the dashed lines i1, i2, i3).

FIG. 11i shows the output value Q3 of the third flip-flop 74. During the time-interval that the signal Q3 has the value "1", the reset mode of the multiplexer 51 is selected. The multiplexer 51 then couples the data input D of the flip flop 4 to a reset value source which provides a constant output value "0".

FIG. 11j shows that the clock signal CLout2 is originally not synchronized with the clock CLout1 shown in FIG. 11k. However, because the data input D of the flip flop 48 is coupled to the reset value source the value of the clock signal CLout2 is maintained at a value 0 until the first positive transition of the signal CL3 after the output signal Q3 of the third flip flop 74 returns to 0. This transition takes place at a positive transition of the clock CL3 between two positive transitions of the clock CL2. This has the result that the first positive transition of the CLout2 signal coincides with the first positive transition of the CL2. Hence the clock signal CLout2 with a duty-cycle of 50% not only has the same frequency as the signal CLout1, but also the same phase.

What is claimed is:

1. A clock generation circuit (30) comprising:
   a programmable frequency divider (46) having a single clock input (45) for receiving an input clock signal (CLin), said programmable frequency divider (46) for generating an intermediate clock signal (CLa) from the input clock signal (CLin),
   a first logical unit (47) having a first input for receiving the the input clock signal (CLin) and a second input for receiving the intermediate clock signal (CLa), the first logical unit (47) for combining the input clock signal (CLin) and the intermediate clock signal (CLa) into a combined clock signal,
   a clocked bi-stable unit (48) having a clock input directly coupled to an output of the first logical unit (47) for receiving the combined clock signal, the clocked bi-stable unit (48) further having a data input directly connected to an output (49c) of a second logical unit (49) and a data output directly connected to an input (49b) of said second logical unit,
   said second logical unit (49) having a selection input connected directly to an output of a synchronization module (51) for receiving a synchronization signal (SorR), said synchronization module (51) having an input (71a) for receiving said input clock signal (CLin), the synchronization signal controlling selection between a feedback mode and a reset mode, in which during the feedback mode the second logical unit (49) logically couples the data input of said clocked bi-stable unit (48) inversely to the data output, and in which during the reset mode the second logical unit (49) provides a reset value to the data input, and
   an output (50) coupled to the data output for providing an output clock signal (Clout2).

2. Clock generation circuit according to claim 1, characterized in that the synchronization module (7) comprises a third logical unit (71), a first further clocked bistable unit (72) having a data-input coupled to an output of the third logical unit (71), a second further clocked bistable unit (73) having a data input coupled to a data output of the first further clocked bistable unit (72) and a third further clocked bistable unit (74) having a data input coupled to a data output of the second further clocked bistable unit (73), the third logical unit (71) having a first input (71a) for receiving a signal (START) which represents the start of a sync procedure, a second input (71b) coupled to the data output of the first further clocked bistable unit (72) and a third input (71c) coupled to the second further clocked bistable unit (73) for stopping the sync procedure, the input (7a) for receiving the reference clock signal (CLref) being coupled to a clock input (73b) of the second further clocked bistable unit (73).

3. Clock generation circuit according to claim 2, characterized in that the input (7a) for receiving the reference clock signal (CLref) is coupled to the clock input (73b) of the second further clocked bistable unit (73) via a divider (80), a negatively triggered bistable unit (78) and a logical gate (76), wherein an input of the divider is coupled to the input (7a) for receiving the reference clock signal (CLref), and an output of the divider (80) is coupled to a data-input of the negatively triggered bistable unit (78), and a clock input of the negatively triggered bistable unit (78) receives the reference clock signal.

4. Clock generation circuit according to claim 3, characterized in that the first logical unit (47) comprises a further negatively triggered bistable unit (52) and a logical gate (54), wherein the input clock signal (CLin) serves as a clock signal for the further negatively triggered bistable unit (52) and wherein the logical gate (54) receives the intermediate clock signal (CLa) via the further negatively triggered bistable unit (52) as a first input signal and the input clock signal (CLin) as a second input signal.

5. Device for reading/writing information from/to an information carrier (1), comprising a read/write head (2) for reproducing a read signal (Sread) which is represented as a physically detectable pattern in tracks at the information carrier (1) and/or for storing a write signal (Swrite) in the form of a physically detectable pattern in tracks at the information carrier (1), movement means (3) for causing a relative movement between the information carrier (1) and the read/write head (2), a first circuitry module (8.2) for controlling the movement means, a second circuitry module (12,13,16,10) for generating an output information signal (Sout) from the read signal (Sread) by channel decoding and/or error correction decoding and/or for generating the write signal (Swrite) by error correction encoding and/or channel encoding an input information signal (Sin), a clock generation circuit (30) according to claim 1, for providing at least a first and a second clock signal (Sout1, Sout2) to one or more of the circuitry modules, the first clock signal (Sout1) having a duty cycle which differs substantially from 50& and the second clock signal (Sout2) having a duty cycle substantially equal to 50%, and having a frequency and a phase which are substantially equal to those of the first clock signal (Sout1).

6. Device according to claim 5, characterized in that the input information signal (Sin) and the output information signal (Sout) represent an audio stream.

* * * * *